United States Patent
Wang et al.

(10) Patent No.: US 6,171,913 B1
(45) Date of Patent: Jan. 9, 2001

(54) PROCESS FOR MANUFACTURING A SINGLE ASYMMETRIC POCKET IMPLANT

(75) Inventors: Jau-Jey Wang, Hsin-Chu; Chaochieh Tsai, Taichung; Jing-Meng Liu, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/149,256

(22) Filed: Sep. 8, 1998

(51) Int. Cl.[7] .................................................. H01L 21/336
(52) U.S. Cl. ........................ 438/289; 438/290; 438/299
(58) Field of Search .................................... 438/289, 290, 438/291, 292, 299, 301, 302, 305, 307, 306, 199, 217, 231, 233, 664, 683

(56) References Cited

U.S. PATENT DOCUMENTS

| | | | |
|---|---|---|---|
| 3,861,968 | * 1/1975 | Magdo et al. | 148/175 |
| 4,965,652 | * 10/1990 | Madgo et al. | 352/50 |
| 5,223,458 | * 6/1993 | Shanfield et al. | 437/225 |
| 5,409,848 | * 4/1995 | Han et al. | 437/35 |
| 5,492,847 | * 2/1996 | Kao et al. | 437/44 |
| 5,492,849 | * 2/1996 | Kao et al. | 437/44 |
| 5,518,942 | 5/1996 | Shrivastava | 437/43 |
| 5,554,544 | * 9/1996 | Hsu | 437/35 |
| 5,595,919 | 1/1997 | Pan | 437/29 |
| 5,618,740 | 4/1997 | Huang | 438/224 |
| 5,650,343 | 7/1997 | Burr et al. | 437/30 |
| 5,668,024 | 9/1997 | Tsai et al. | 438/199 |
| 5,712,814 | 1/1998 | Fratin et al. | 365/182 |
| 5,880,483 | * 3/1999 | Shanfield et al. | 257/22 |
| 6,037,230 | * 3/2000 | Holloway | 438/289 |

* cited by examiner

*Primary Examiner*—Charles Bowers
*Assistant Examiner*—Laura M Schillinger
(74) *Attorney, Agent, or Firm*—George O. Saile; Stephen B. Ackerman

(57) ABSTRACT

A process is described for forming a buried, or pocket, ion implant in a semiconductor device. In particular, said pocket is limited to only the drain side of a field effect transistor. To achieve this the photoresist that is used to protect the source and drain regions during ion implantation is located at different distances from the gate pedestal. The photoresist on the source side is placed closer to the gate pedestal than it is on the drain side. As a result, when ions arrive at the surface at a sufficiently shallow angle to be able to penetrate the semiconductor regions immediately beneath the gate oxide, photoresist at the source side blocks the beam while the photoresist on the drain side is far enough away from the gate not to intercept the beam. Thus, a single asymmetrically located pocket is formed in a single step.

16 Claims, 2 Drawing Sheets

PROCESS FOR MANUFACTURING A SINGLE ASYMMETRIC POCKET IMPLANT

FIELD OF THE INVENTION

The invention relates to the general field of field effect transistors having very narrow channel widths with particular reference to the inclusion of an asymmetric single 'pocket' implant limited to the drain side.

BACKGROUND OF THE INVENTION

As field effect transistors grow ever smaller, problems begin to arise because of the very short channels that have to be used. In particular, the punchthrough resistance of these devices is often very low. A solution to this problem that has been widely adopted in the industry has been to include an additional implant close to the low density drain. In order to achieve uniformity across the full wafer, it is usual to rotate the wafer during the implantation. As a result, the prior art practice has generally been to simultaneously form a pair of such 'pocket' implants, one near the source and one near the drain as this happens automatically. From a performance standpoint only the implant close to the drain is needed so many processes end up with two pocket implants even though the space taken up by the implant close to the source is valuable real estate, particularly as devices continue to grow smaller. It is therefore desirable to form an asymmetric device having a pocket implant only on the drain side. While this is known in the prior art, forming such an asymmetric arrangement has required additional process steps. The method of the present invention allows asymmetric design to be implemented without these additional steps.

In searching the prior art we have been unable to find a process that achieves a single sided pocket implant in the manner taught by the present invention. The following references have, however, been found to be of interest:

Burr et al. (U.S. Pat. No. 5,650,340 July 1997) describes a device having an asymmetric pocket implant under either the source or the drain. Shrivastava (U.S. Pat. No. 5,518,942 May 1996) shows a large angle single sided implant under the source. Kao et al. (U.S. Pat. No. 5,492,847 February 1996) as well as Hsu ( U.S. Pat. No. 5,554,544 September 1996), Pan (U.S. Pat. No. 5,595, 919 January 1997), Huang (U.S. Pat. No. 5,618,740 April 1997), and Tsai et al. (U.S. Pat. No. 5,668,024 September 1997) all show pocket implants using various implant processes including large angle ion implantation.

Han (U.S. Pat. No. 5,409,848 April 1995) and Fratin et al. (U.S. Pat. No. 5,712,814 January 1998) also teach examples of large angle ion implants.

SUMMARY OF THE INVENTION

It has been an object of the present invention to provide a method for forming a 'pocket' ion implant.

It has been a further object of the present invention to form said 'pocket' ion implant on only one side of the device.

Another object of the present invention has been to provide a method whereby said single asymmetric implant may be formed in a single step.

These objects have been achieved by locating the photoresist that is used to protect the source and drain regions during ion implantation at different distances from the gate pedestal. The photoresist on the source side is placed closer to the gate pedestal than it is on the drain side. As a result, when ions arrive at the surface at a sufficiently shallow angle to be able to penetrate the semiconductor regions immediately beneath the gate oxide, photoresist at the source side blocks the beam while the photoresist on the drain side is far enough away from the gate not to interfere with the beam. Thus, a single asymmetrically located pocket is formed in a single step.

DESCRIPTION OF THE PREFERRED EMBODIMENTS

Figure 1:
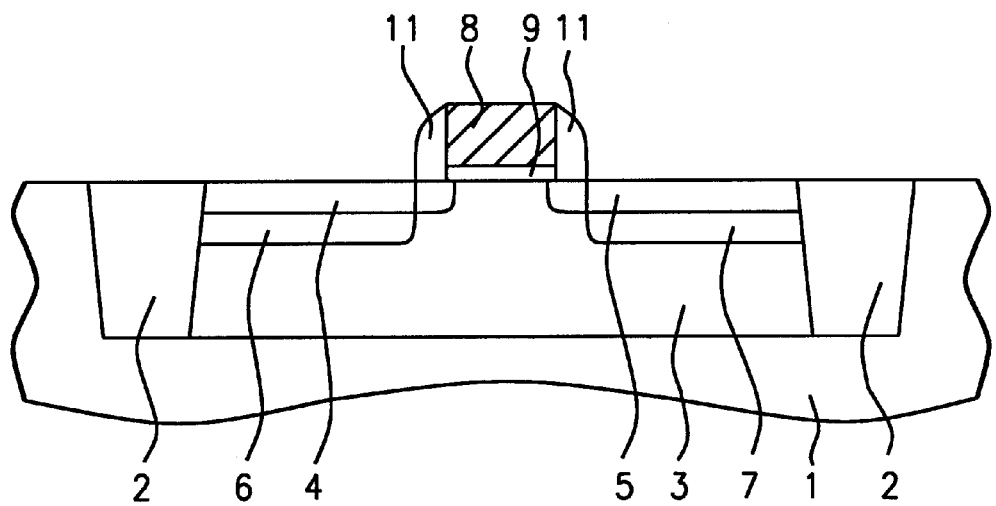
FIG. 1 is a cross-section of a partly completed field effect transistor showing the formation of a lightly doped source and drain.

While the invention will be described in terms of the formation of a field effect transistor it will be understood that the invention is more general and can be used for any application wherein it is desired to selectively deposit a pocket of implanted material, including in a integrated circuit. We begin a description of the present invention by referring to FIG. 1. Silicon body 1 includes shallow trenches 2 that have been filled with silicon oxide to provide isolation from other nearby devices. P-well 3 occupies the space between the two trenches. To form the field effect transistor a layer of oxide is formed on the surface of the silicon body 1. This is followed by the deposition of a layer of polysilicon on the oxide. The polysilicon is then patterned and etched to form gate pedestal 8 which is centrally located between the two shallow trenches and has oxide layer 9 between itself and the surface of the P-well.

With the gate pedestal in place a first ion implantation of N type dopant ions is performed. Doping for the first implantation is light and depth of implantation is shallow resulting in regions 4 and 5 as the first parts of the source and drain respectively. Insulating spacers 11 are then grown on the vertical sides of gate pedestal 8 following which a second ion implantation takes place to form regions 6 and 7 of the source and drain respectively, these regions being more heavily doped and deeper than regions 4 and 5. This compound structure formed from regions 4 and 6 and 5 and 7 is referred to as a lightly doped source and drain. Contact to the source drain and gate respectively are made using the SALICIDE process. To achieve this a layer of a silicide forming material is deposited on all surfaces. Following a suitable heat treatment the metal reacts with the silicon selectively wherever it is in direct contact with silicon with no reaction occurring where it is a contact with silicon oxide. After a suitable etch to remove all unreacted metal we are left with silicide contacts to the silicon surfaces only.

In a conventional field effect transistor the finished device would have the appearance shown in FIG. 1. However, as discussed earlier, it is advantageous to implant additional material close to the drain. As mentioned earlier, the prior art either generates these pocket implants on both sides (i.e. close to both the source and the drain) or requires multiple steps in order to produce a pocket implant on one side only.

Figure 2:
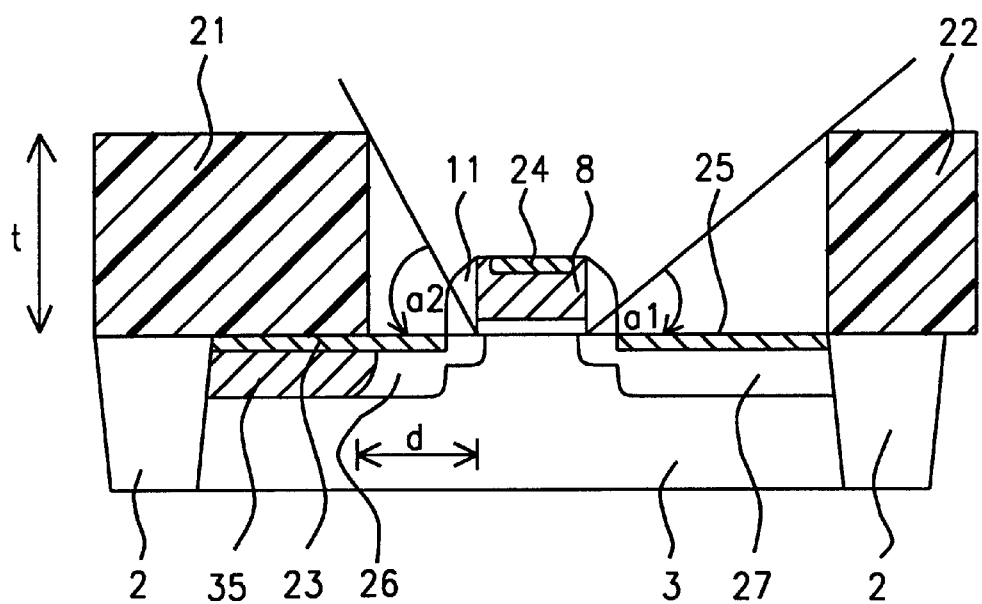
FIG. 2 illustrates how use of asymmetrically disposed photoresist controls the angle at which an ion beam may penetrate to the region below the gate oxide layer.

In FIG. 2 we illustrate the approach taken by the present invention which allows a single pocket implant to be generated in a single step. As is standard practice, a layer of photo resist is used to protect material that is not to be ion implanted. However, in a key feature of the invention, the photo resist layer is not symmetrical with respect to the gate. Thus, the photo resist portion to the left of the gate (layer 21) is located closer to the gate than is photo resist portion 22. Since both portions 21 and 22 are deposited at the same time they have the same thickness t. Typically, t is between about 0.4 and 0.7 microns thick.

It can be seen in FIG. 2 that because of the different distances the cutoff angle for incoming ions is steeper on the left side than on the right side. As can be seen, ions that arrive at angle a2, or angles closer to the vertical, will be prevented from entering the regions immediately underneath gate oxide 9 whereas ions arriving from the right hand side are able to make an angle as a shallow as a1 with respect to the surface. Ions arriving at such a shallow angle are able to penetrate beneath the gate oxide thereby forming a pocket region close to the drain.

Typically the angle at which ions are directed relative to the surface is between about 30 (a1) and 45 (a2) degrees. In order to achieve these limitations the distance between left photo resist 21 and the gate pedestal is between about 0.2 and 0.4 microns while the distance between right photo resist 22 and the gate is greater than about 0.5 microns. Since the position of the source and drain relative to the gate pedestal will be different in different parts of the circuit, and in order to achieve a high degree of uniformity, the device (i.e. the wafer) is rotated during ion implantation. Typically, 4 rotations of 90° each are used.

In the case of the current example, the implanted pocket region will be formed from N-type dopant ions such as arsenic and phosphorus. For a P channel device, the appropriate P-type dopant ions would be used.

Figure 3:
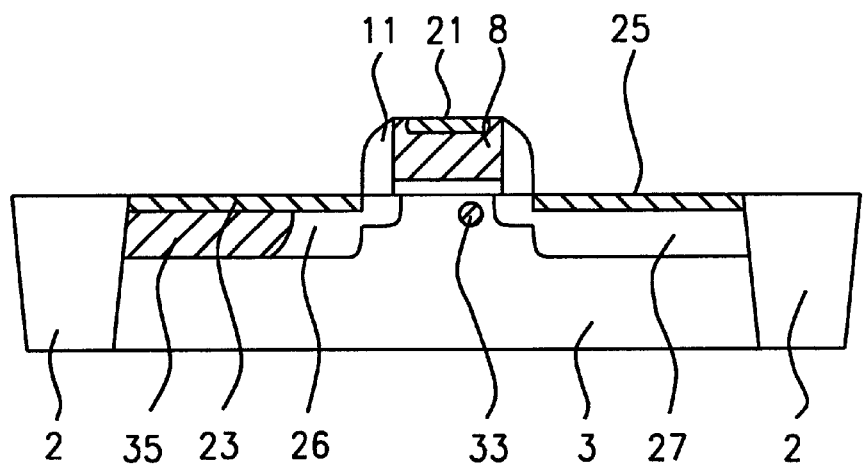
FIG. 3 illustrates how the use of the constraints defined in FIG. 2 result in the placement of an implanted region in the desired location.

In FIG. 3 we illustrate the finished device formed according to the method of the present invention. As can be seen, a pocket 33 of in type material has been formed within the P-well just below the gate oxide and very close to the drain. In order to be able to place the ions in the correct position an arsenic ion beam having an energy between about 70 and 90 kV was used. In order to achieve the correct concentration of the dopant ions, an ion dosage between about $10^{13}$ and $10^{14}$ ions per square cm was used.

Figure 4:
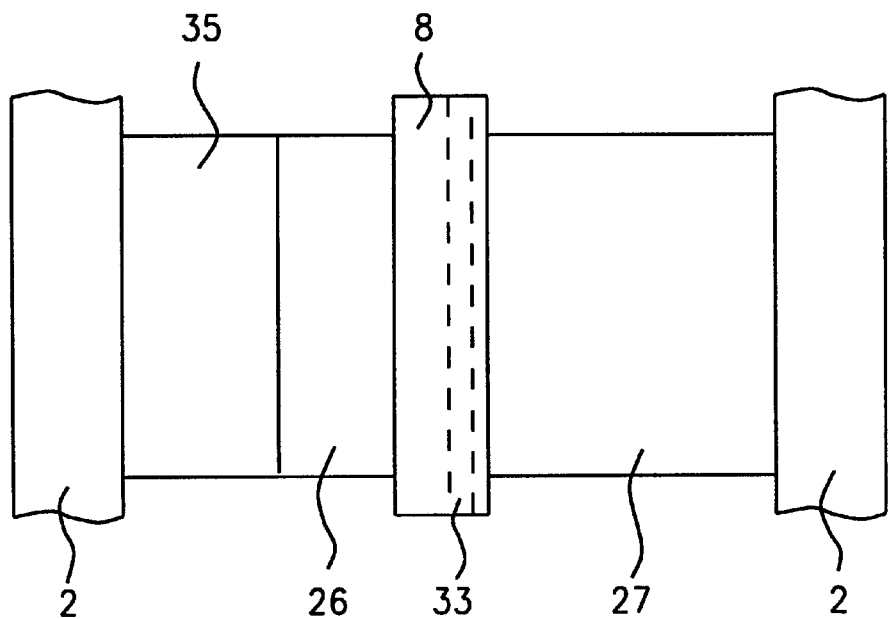
FIG. 4 is a plan view of the cross-section shown in FIG. 3.

FIG. 4 is a plan view of the cross-section shown in FIG. 3.

While the invention has been particularly shown and described with reference to the preferred embodiments thereof, it will be understood by those skilled in the art that various changes in form and details may be made without departing from the spirit and scope of the invention.

What is claimed is:

1. A process for forming a single side-pocket implant comprising:

providing a field effect transistor having a top surface and source and drain regions separated by a gate pedestal;

depositing a layer of photoresist, having a thickness, over said surface;

patterning said layer of photoresist whereby the source region in covered, except within a first distance form the gate pedestal, and the drain region is covered, except within a second distance form the gate pedestal; and rotating the field effect transistor four times and directing a beam of energetic ions at an angle of 90 degrees relative to the surface, thereby implanting a pocket of ions directly beneath the gate pedestal close to the drain.

2. The process of claim 1 wherein said thickness is between about 0.7 and 0.4 microns.

3. The process of claim 1 wherein the angle of the beam is between about 30 and 45 degrees.

4. The process of claim 1 wherein said first distance is between about 0.2 and 0.4 microns.

5. The process of claim 1 wherein said second distance is greater than about 0.5 microns.

6. The process of claim 1 wherein said energetic ions are selected from the group consisting of arsenic, phosphorus, and antimony.

7. The process of claim 1 wherein said energetic ions have an energy between about 70 and 90 kV.

8. The process of claim 1 wherein said beam applies a dose of ions between about $10^{13}$ and $10^{14}$ ions per cm$^2$.

9. A process for manufacturing a field effect transistor comprising:

providing a body of silicon that includes opposing trenches filled with oxide and having a P-well located between them;

forming a layer of gate oxide over said P-well;

depositing a layer of polysilicon on said oxide layer and then patterning and etching said layer of polysilicon to form a gate pedestal having two sides;

forming lightly doped source and drain regions on both sides of the gate;

forming silicide contacts to the source, drain, and gate by means of a SALICIDE process;

depositing a layer of photoresist, having a thickness, over said field effect transistor;

patterning said layer of photoresist whereby the source region is covered except within a first distance from the gate pedestal and the drain region is covered except within a second distance from the gate pedestal; and while rotating the field effect transistor four times, directing a beam of energetic ions at an angle of 90 degrees relative to the field effect transistor surface, thereby implanting a pocket of ions directly beneath the gate pedestal close to the drain.

10. The process of claim 9 wherein said thickness is between about 0.4 and 0.7 microns.

11. The process of claim 9 wherein the angle of the beam is between about 45 and 70 degrees.

12. The process of claim 9 wherein said first distance is between about 0.2 and 0.4 microns.

13. The process of claim 9 wherein said second distance is greater than about 0.5 microns.

14. The process of claim 9 wherein said energetic ions are selected from the group consisting of arsenic, phosphorus, and antimony.

15. The process of claim 9 wherein said energetic ions have an energy between about 70 and 90 kV.

16. The process of claim 9 wherein said beam applies a dose of ions between about $10^{13}$ and $10^{14}$ ions per cm$^2$.

* * * * *